(12) United States Patent
Chang et al.

(10) Patent No.: US 9,553,171 B2
(45) Date of Patent: Jan. 24, 2017

(54) FIN FIELD EFFECT TRANSISTOR (FINFET) DEVICE AND METHOD FOR FORMING THE SAME

(71) Applicant: Taiwan Semiconductor Manufacturing Co., Ltd, Hsin-Chu (TW)

(72) Inventors: Che-Cheng Chang, New Taipei (TW); Yung-Jung Chang, Cyonglin Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 61 days.

(21) Appl. No.: 14/180,932

(22) Filed: Feb. 14, 2014

(65) Prior Publication Data

US 2015/0236131 A1    Aug. 20, 2015

(51) Int. Cl.
H01L 27/088 (2006.01)
H01L 27/12 (2006.01)
H01L 29/66 (2006.01)

(52) U.S. Cl.
CPC ..... H01L 29/66795 (2013.01); H01L 27/0886 (2013.01); H01L 29/66545 (2013.01)

(58) Field of Classification Search
CPC ...... H01L 29/66; H01L 27/0886; H01L 29/40; H01L 21/28; H01L 29/78; H01L 21/31; H01L 21/26
USPC ............... 257/401, 347, 192, 412, 369, 288, 257/E21.403; 438/232, 285, 283
See application file for complete search history.

(56) References Cited

U.S. PATENT DOCUMENTS

| | | | |
|---|---|---|---|
| 2001/0033000 A1* | 10/2001 | Mistry | H01L 29/42376 257/339 |
| 2002/0158254 A1* | 10/2002 | Hsu | H01L 21/8213 257/77 |
| 2006/0214231 A1* | 9/2006 | Shah | H01L 29/42384 257/347 |
| 2009/0321836 A1* | 12/2009 | Wei | H01L 29/66628 257/365 |
| 2011/0171795 A1* | 7/2011 | Tsai | H01L 21/26513 438/232 |
| 2011/0278676 A1* | 11/2011 | Cheng | H01L 21/823807 257/369 |
| 2012/0292715 A1* | 11/2012 | Hong | H01L 21/845 257/392 |
| 2013/0083589 A1* | 4/2013 | Or-Bach | G11C 11/406 365/149 |
| 2013/0140601 A1* | 6/2013 | Mouli | H01L 27/1027 257/133 |

(Continued)

FOREIGN PATENT DOCUMENTS

KR  10-2013-0086892  *  7/2013  ............. H01L 29/78

Primary Examiner — Yuanda Zhang
Assistant Examiner — Sheikh Maruf
(74) Attorney, Agent, or Firm — Birch, Stewart, Kolasch & Birch, LLP (57) ABSTRACT

Embodiments for forming a fin field effect transistor (FinFET) device structure are provided. The FinFET device structure includes a substrate and a first fin structure extending above the substrate. The FinFET also includes a first transistor formed on the first fin structure. The first transistor includes a first gate dielectric layer conformally formed on the first fin structure and a first gate electrode formed on the first gate dielectric layer. The FinFET further includes an inter-layer dielectric (ILD) structure formed adjacent to the first transistor. The first gate electrode is in direct contact with a sidewall of the ILD structure.

17 Claims, 9 Drawing Sheets

(56) References Cited

U.S. PATENT DOCUMENTS

| | | | |
|---|---|---|---|
| 2013/0193481 A1* | 8/2013 | Bryant | H01L 29/66742 257/192 |
| 2013/0224939 A1* | 8/2013 | Jagannathan | H01L 21/823842 438/585 |
| 2013/0277746 A1* | 10/2013 | Baldauf | H01L 21/823807 257/368 |
| 2014/0070328 A1* | 3/2014 | Goto | H01L 21/823431 257/401 |
| 2014/0217499 A1* | 8/2014 | Lee | H01L 29/20 257/334 |
| 2014/0227846 A1* | 8/2014 | Liaw | H01L 29/66795 438/283 |
| 2014/0299934 A1* | 10/2014 | Kim | H01L 29/7848 257/347 |
| 2015/0014780 A1* | 1/2015 | Kim | H01L 27/0924 257/369 |
| 2015/0028430 A1* | 1/2015 | Lee | H01L 29/4966 257/412 |
| 2015/0035069 A1* | 2/2015 | Hung | H01L 27/1211 257/369 |
| 2015/0041913 A1* | 2/2015 | An | H01L 29/7856 257/369 |
| 2015/0069473 A1* | 3/2015 | Glass | H01L 21/02175 257/288 |
| 2015/0093868 A1* | 4/2015 | Obradovic | H01L 21/823431 438/283 |
| 2015/0206974 A1* | 7/2015 | Lim | H01L 29/7851 257/288 |
| 2015/0214370 A1* | 7/2015 | Kim | H01L 29/7853 257/401 |
| 2015/0221761 A1* | 8/2015 | Tan | H01L 29/785 257/347 |
| 2015/0279997 A1* | 10/2015 | Koldiaev | H01L 29/7851 257/401 |

* cited by examiner

FIN FIELD EFFECT TRANSISTOR (FINFET) DEVICE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
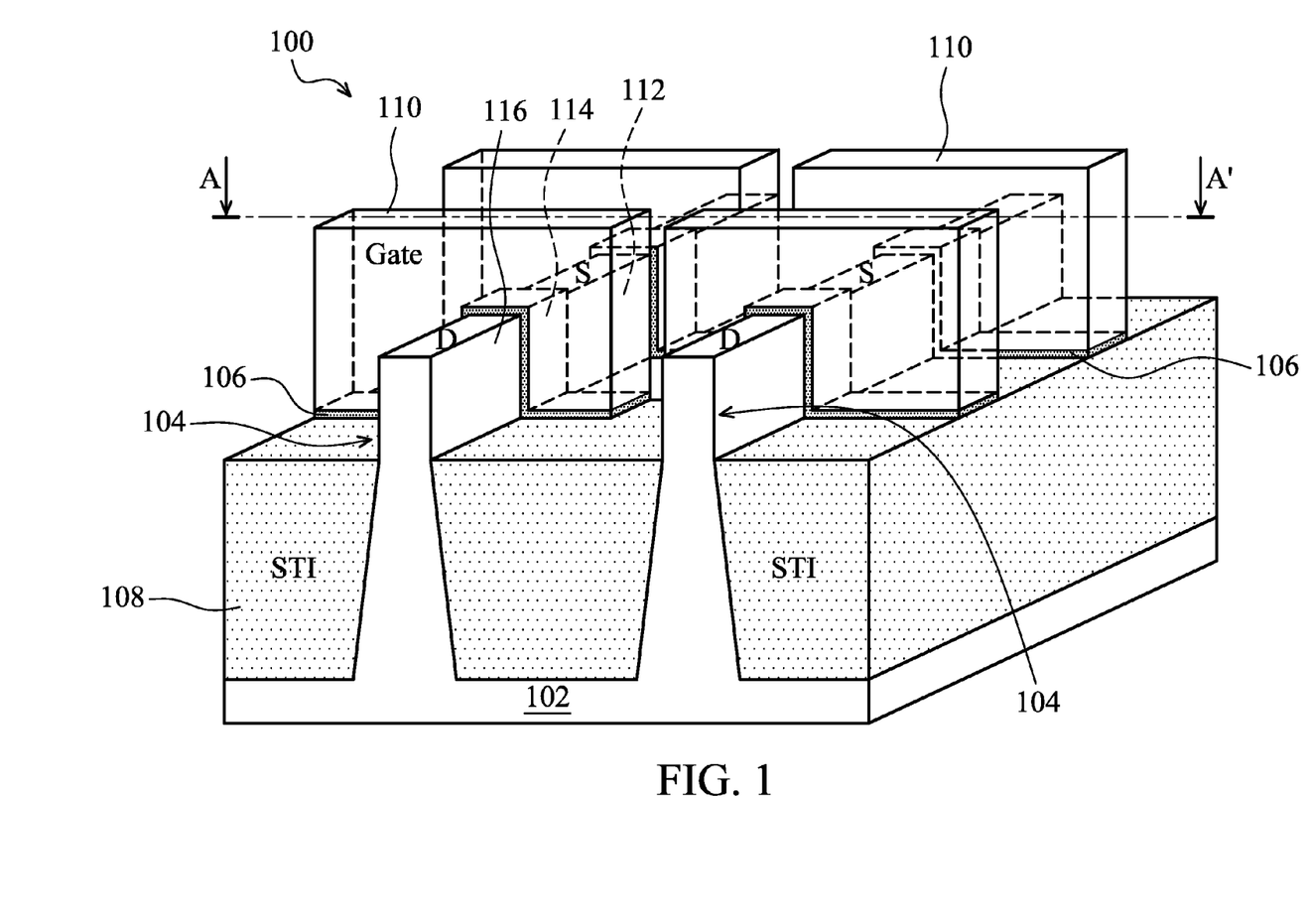
FIG. 1 shows a perspective representation of a fin field effect transistor (FinFET) device structure, in accordance with some embodiments.

Embodiments for forming a fin field effect transistor (FinFET) device structure are provided. FIG. 1 shows a perspective representation of a fin field effect transistor (FinFET) device structure 100, in accordance with some embodiments of the disclosure.

FinFET device structure 100 includes a substrate 102. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

FinFET device structure 100 also includes one or more fin structures 104 (e.g., Si fins) that extend from the substrate 102. Fin structures 104 may optionally include germanium. Fin structures 104 may be formed by using suitable processes such as photolithography and etching processes. In some embodiments, fin structures 104 are etched from substrate 102 using dry etch or plasma processes.

An isolation structure 108, such as a shallow trench isolation (STI) structure, is formed to surround fin structures 104. In some embodiments, a lower portion of fin structures 104 is surrounded by isolation structure 108, and an upper portion of fin structures 104 protrudes from isolation structure 108, as shown in FIG. 1. In other words, a portion of fin structures 104 is embedded in isolation structure 108. Isolation structure 108 prevents electrical interference or crosstalk.

FinFET device structure 100 further includes a gate stack structure including a gate electrode 110 and a gate dielectric layer 106. The gate stack structure is formed over a central portion of fin structures 104. In some embodiments, multiple gate stack structures are formed over fin structures 104. Numerous other layers may also be present in the gate structures, for example, capping layers, interface layers, spacer elements, and/or other suitable features.

Gate dielectric layer 106 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

Gate electrode 110 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. Gate electrode 110 may be formed in a gate last process (or gate replacement process). In some embodiments, the gate stack structure includes additional layers, such as interfacial layers, capping layers, diffusion/barrier layers, or other applicable layers.

Fin structures 104 includes a channel region 112 surrounded or wrapped by gate electrode 110 and gate dielectric layer 106. Fin structures 104 may be doped to provide a suitable channel for an n-type FinFET (NMOS device) or a p-type FinFET (PMOS device). Fin structures 104 may be doped using a suitable process, such as an ion implantation process, diffusion process, annealing process, other applicable processes, or combinations thereof. Fin structures 104 includes a source region 114 and a drain region 116 between the channel region 112. FinFET device 100 may be a device included in a microprocessor, memory cell (e.g., Static Random-Access Memory (SRAM)), and/or other integrated circuits.

Figure 2:
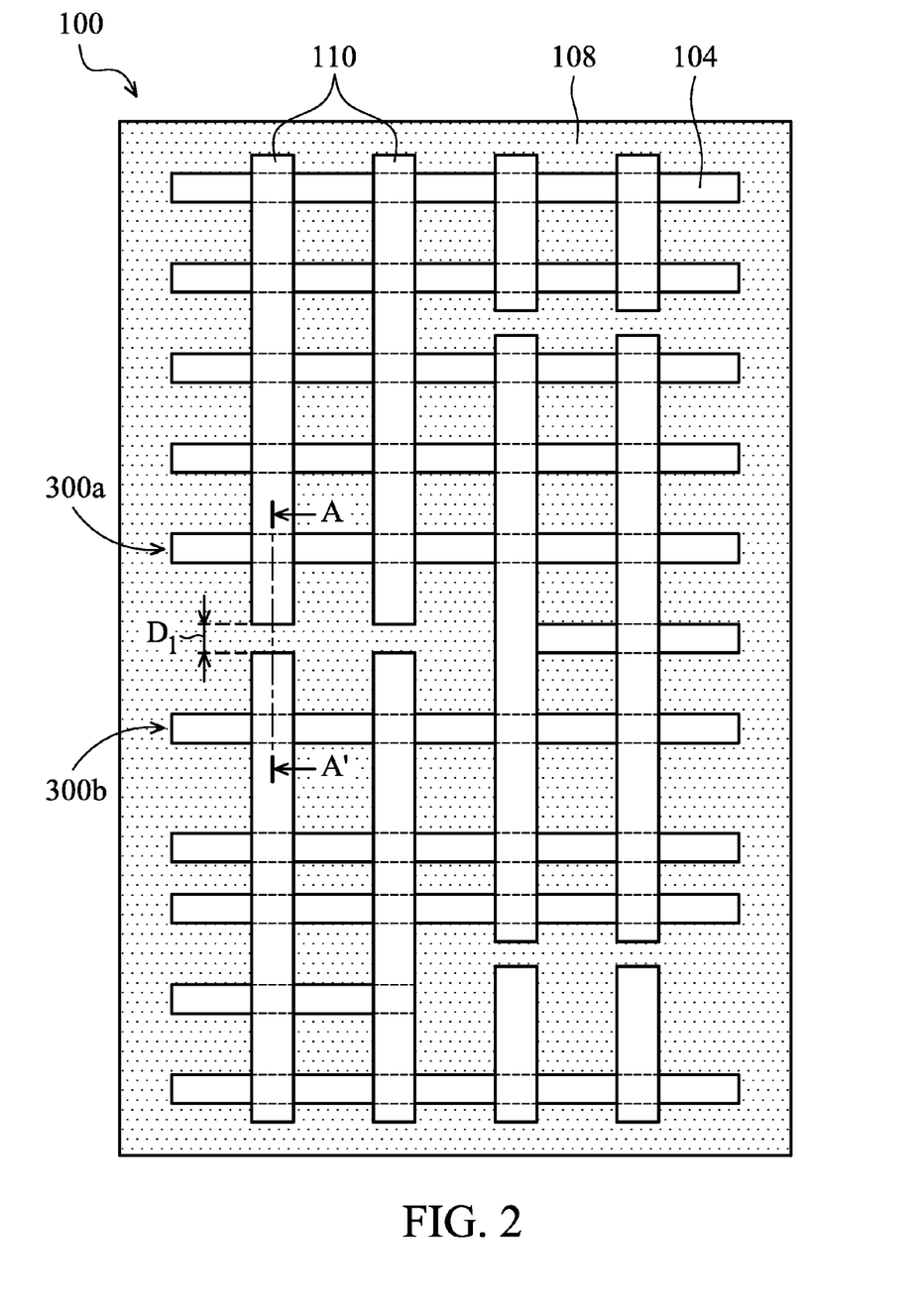
FIG. 2 shows a top-view of a fin field effect transistor (FinFET) device structure, in accordance with some embodiments.

FIG. 2 shows a top-view of a fin field effect transistor (FinFET) device structure 100, in accordance with some embodiments of the disclosure. FinFET device structure 100 includes multiple fin structures 104 and multiple gate electrodes 110. Gate electrodes 110 traverse over fin structures 104. FinFET device structure 100 is surrounded by isolation structure 108.

As shown in FIG. 2, fin structures 104 may be substantially parallel to each other. Gate electrodes 110 may also be parallel to each other and substantially perpendicular to the fin structures 104. In some embodiments, gate electrodes 110 are also called as gate electrodes lines when seen from a top-view.

A first transistor 300a is formed on one of fin structures 104, and a second transistor 300b is formed on another one of fin structures 104. In some embodiments, a distance ($D_1$) between first transistor 300a and second transistor 300b is in a range from about 10 nm to about 200 nm.

FIGS. 3A-3H show cross-sectional representations of various stages of forming a fin field effect transistor (FinFET) device structure, in accordance with some embodiments of the disclosure. FIGS. 3A-3H are cross-sectional representations taken along AA' line of FIG. 2. FIGS. 3A-3H shows a gate-last process to form high-k/metal gate (HK/MG) structure.

Figure 3A:
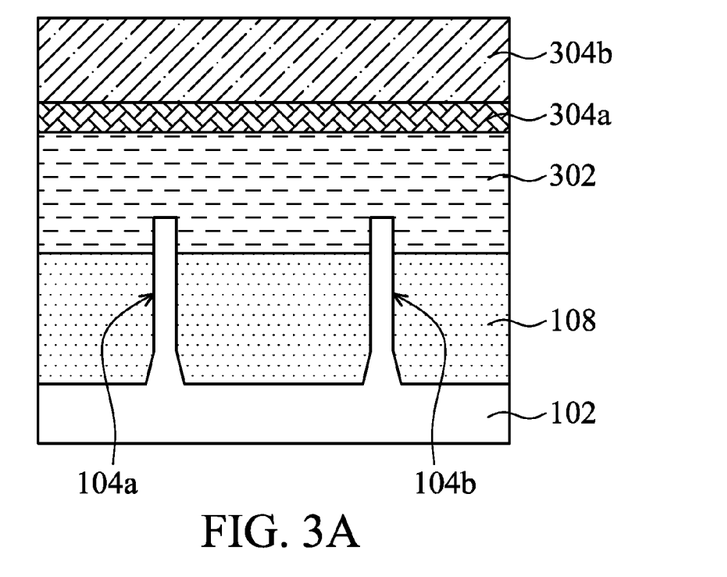
FIGS. 3A-3H show cross-sectional representations of various stages of forming a fin field effect transistor (FinFET) device structure, in accordance with some embodiments.

Referring to FIG. 3A, fin structures 104a and 104b are formed over substrate 102. In some embodiments, the substrate 102 is etched to form fin structures 104a and 104b by first depositing and patterning a hard mask layer (not shown) on substrate 102. The hard mask layer forms a pattern covering a portion of substrate 102. Afterwards, substrate 102 is etched to form trenches between the regions covered by the hard mask layer. As a result, fin structures 104a and 104b are formed between the trenches.

Afterwards, a dielectric material (e.g., silicon oxide) is deposited into the trenches and covers fin structures 104a and 104b. The dielectric material is planarized down to the top surfaces of fin structures 104a and 104b or the hard mask layer, and then the dielectric material is etched to a level below the top surfaces of fin structures 104a and 104b. As a result, an upper portion of fin structures 104a and 104b protrudes above isolation structure 108, and a lower portion of fin structures 104a and 104b is surrounded and covered by isolation structure 108.

Alternatively, in some other embodiments, isolation structure 108 is firstly formed over substrate 102. Trenches between isolation structure 108 are formed to expose substrate 102. A semiconductor material, such as silicon, silicon germanium, or other applicable materials, is then grown in the trenches to form fin structures 104a and 104b by using, for example, an epitaxial process. After fin structures 104a and 104b are grown to the desired height, isolation structure 108 is etched down to a level below the top surface of fin structures 104. As a result, a portion of fin structures 104a and 104b protrudes above isolation structure 108.

As shown in FIG. 3A, a polysilicon layer 302 is formed on fin structures 104a and 104b and isolation structure 108. Afterwards, one or more hard masks 304a, 304b are formed over polysilicon layer 302. Hard mask 304a may be made of silicon oxide, silicon nitride, silicon oxynitride, or other applicable materials. Hard mask 304b may be made of silicon oxide, silicon nitride, silicon oxynitride, or other applicable materials. Hard masks 304a, 304b are formed by a patterning process. The patterning process includes a photolithography process and an etching process. The photolithography processes include photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 3B:
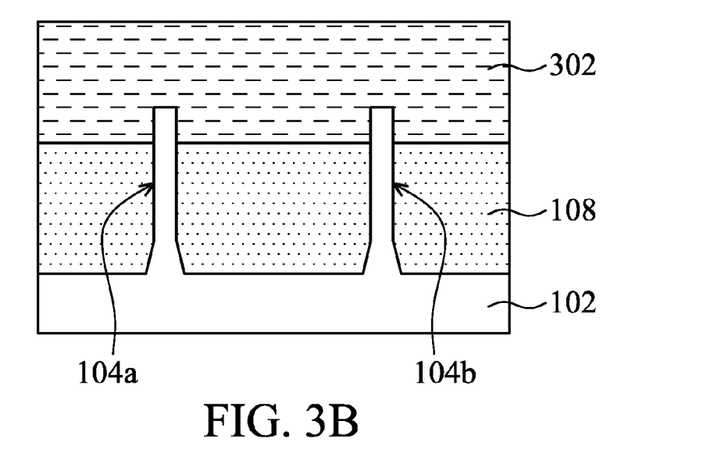

After forming hard masks 304a and 304b, a portion of polysilicon layer 302 are removed by using hard masks 304a and 304b as a mask as shown in FIG. 3B in accordance with some embodiments of the disclosure. In some embodiments, polysilicon layer 302 is removed by an etching process, such as a wet etching process or a dry etching process. It should be noted that although in FIG. 3B, polysilicon layer 302 is remaining when seen from other cross-sectional views, a portion of polysilicon layer 302 is removed.

Figure 3C:
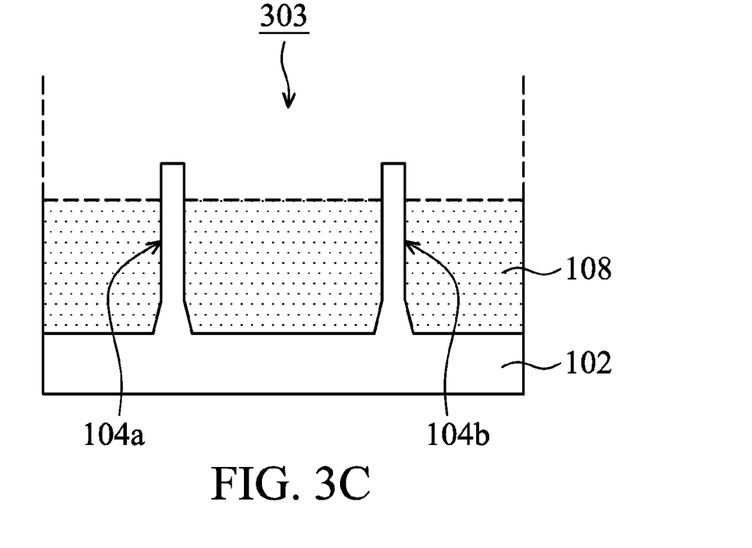

Afterwards, polysilicon layer 302 is removed to form a trench 303 as shown in FIG. 3C in accordance with some embodiments of the disclosure. In some embodiments, polysilicon layer 302 is removed by an etching process, such as a wet etching process or a dry etching process.

Figure 3D:
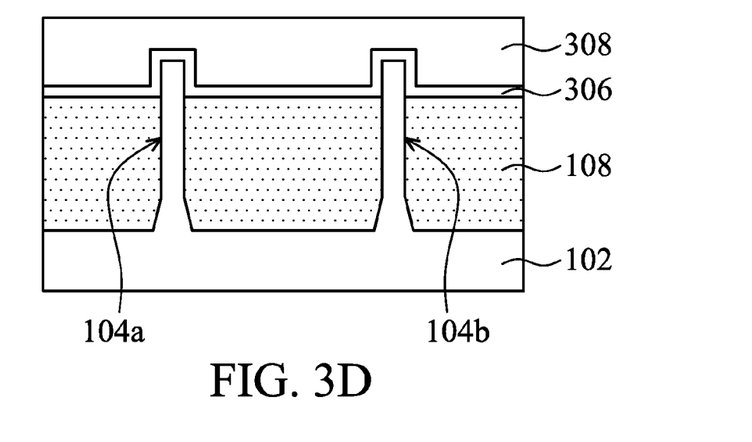

After polysilicon layer 302 is removed, a gate dielectric layer 306 is conformally formed on fin structures 104a and 104b as shown in FIG. 3D in accordance with some embodiments of the disclosure.

Gate dielectric layer 306 includes high dielectric constant (high-k) dielectric materials. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like. In some embodiments, gate dielectric layer 306 is formed by deposition processes, such as a CVD process, HDPCVD process, spin-on process, sputtering process, and/or combinations thereof.

Gate electrode 308 includes n-type work function metal or p-type work function metal. The n-type work function metal includes tungsten (W), copper (Cu), titanium (Ti), silver (Ag), aluminum (Al), titanium aluminum alloy (TiAl0), titanium alumina nitride (TiAlN), tantalum carbide (TaC), tantalum carbon nitride (TaCN), tantalum silicon nitride (TaSiN), manganese (Mn), or zirconium (Zr). The p-type work function metal includes titanium nitride (TiN), tungsten nitride (WN), tantalum nitride (TaN), or ruthenium (Ru). Gate electrode 308 is formed by a physical vapor deposition (PVD) process, chemical vapor deposition (CVD) process, plating process, electroless plating process or another applicable process.

Figure 3E:
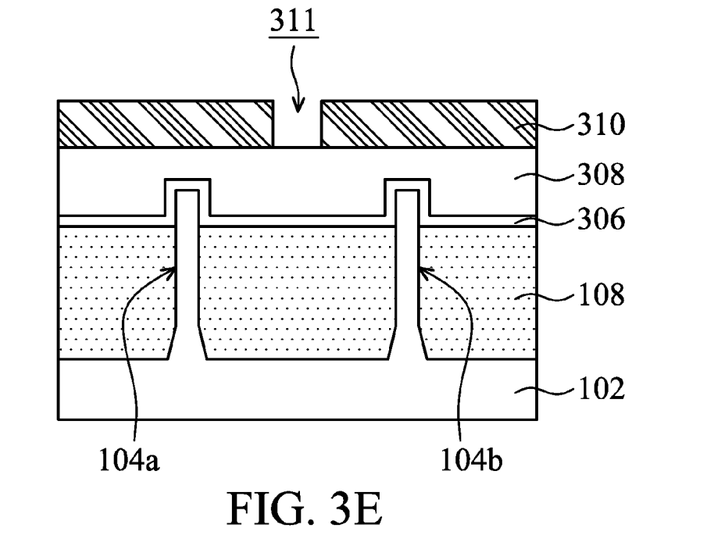

After gate electrode 308 is formed, a photoresist (PR) layer 310 is formed on gate electrode 308 as shown in FIG. 3E in accordance with some embodiments of the disclosure. In some embodiments, first PR layer 310 is a positive resist (positive tone resist). The positive resist is characterized by the exposed regions becoming more soluble in a developer solution.

As shown in FIG. 3E, after photoresist layer 310 is formed, photoresist layer 310 is patterned by a patterning process to form an opening 311 in patterned photoresist layer 310. The patterning process includes a photolithography process and an etching process. The photolithography processes include photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 3F:
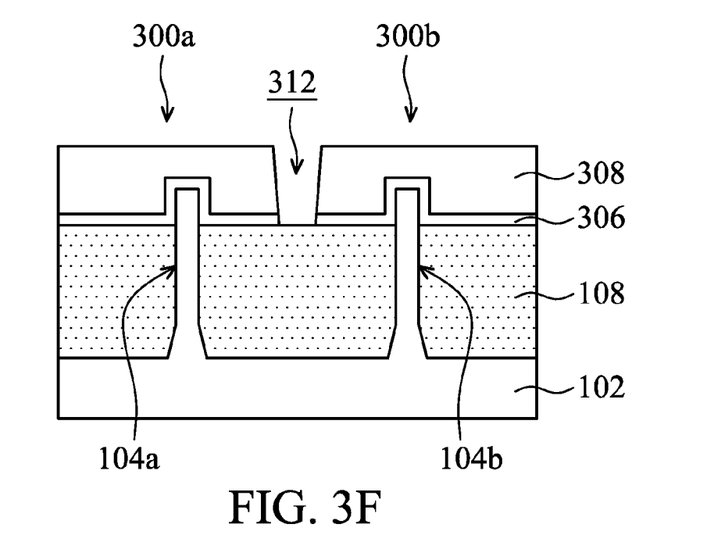

After forming opening 311, gate electrode 308 is etched by an etching process to form a trench 312 in gate electrode 308 as shown in FIG. 3F in accordance with some embodiments of the disclosure. In some embodiments, the etching process includes a dry etching process or wet etching process.

On the left side of trench 312, a first transistor 300a is constructed by gate dielectric layer 306, gate electrode 308, and a source/drain (not shown). On the right side of trench 312, a second transistor 300b is constructed by gate dielectric layer 306, gate electrode 308, and another source/drain (not shown).

Figure 3G:
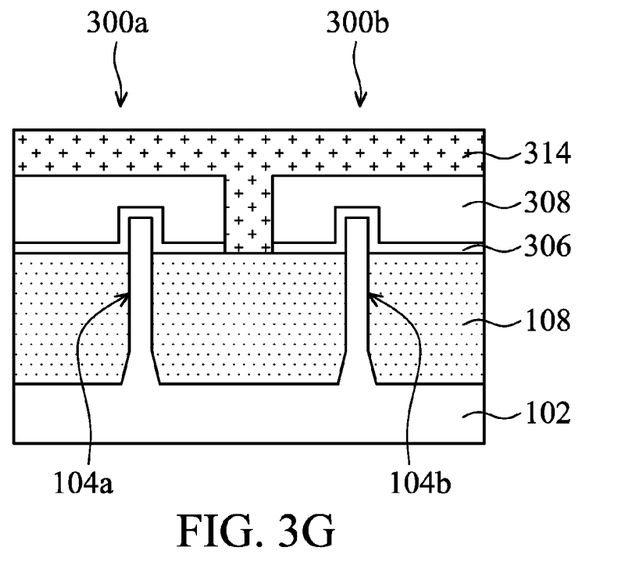

After trench 312 is formed, a dielectric material 314 is filled into trench 312 and on gate electrode 308 as shown in FIG. 3G in accordance with some embodiments of the disclosure.

Figure 3H:
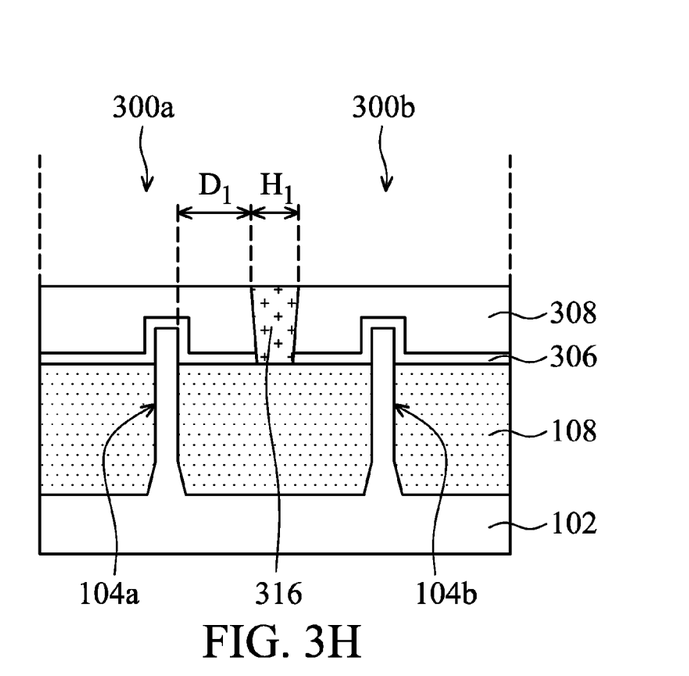

After dielectric material 314 is filled, a portion of dielectric material 314 out of trench 312 is removed by a planarizing process as shown in FIG. 3H in accordance with some embodiments of the disclosure. As a result, an interlayer dielectric (ILD) structure 316 is formed. First transistor 300a and second transistor 300b are on opposite sidewalls of ILD structure 316. When seen from other cross-sectional views, gate electrode 308 is surrounded by the ILD structure 316.

In some embodiments, a top surface of gate electrode 308 is substantially level with a top surface of first transistor 300a and second transistor 300b. In some embodiments, the planarizing process includes a chemical mechanical polishing (CMP) process or another applicable process.

In some embodiments, ILD structure 316 has a width $W_1$ in a range from about 10 nm to about 200 nm. In some embodiments, a distance ($D_1$) between the sidewall of ILD structure 316 and a sidewall of first fin structure 104b is in a range from about 5 nm to about 50 nm.

If an ILD structure is formed next to a fin structure before a gate dielectric layer is formed on the fin structure, a trench is formed between two the protrusions (the ILD structure and the fin structure). When the distance between the ILD structure and the fin structure is reduced, a high aspect ratio of the trench is formed. Therefore, when the gate dielectric layer and a gate electrode are formed on the fin structure, some voids tend to be formed in the trench due to its high aspect ratio. In addition, the voids problems become more serious as the dimensions of a semiconductor device structure are gradually decreased. Furthermore, when multiple dielectric layers are sequentially and conformally formed on fin structures and on the sidewalls of the ILD structure, voids are easily formed in the trench. The voids may increase a resistance (e.g. Rs) of the semiconductor device structure. As a result, the performance of the semiconductor device structure may be degraded.

In order to resolve the void problem, ILD structure 316 is formed after gate dielectric layer 306 and gate electrode 308 are formed. In other words, ILD structure 316 is formed after first transistor 300a and second transistor 300b are formed.

It should be noted that, as shown in FIG. 3H, gate dielectric layer 306 and gate electrode 308 are in direct contact with the sidewalls of ILD structure 316. More specifically, gate dielectric layer 306 covers a bottom portion of the sidewalls of ILD structure 316, and gate electrode 308 covers a top portion of the sidewalls of ILD structure 316. ILD structure 316 is directly sandwiched between two adjacent gate electrodes 306 (or first transistor 300a or second transistor 300b). Gate dielectric layer 306 does not cover the overall sidewalls of ILD structure 316.

Because ILD structure 316 is formed after first transistor 300a and second transistor 300b are formed, an etching process window for forming trench 312 is enlarged. In addition, the filling windows for forming gate dielectric layer 306 and gate electrode 308 are therefore enlarged.

FIGS. 4A-4F show cross-sectional representations of various stages of forming a fin field effect transistor (FinFET) device structure, in accordance with some embodiments of the disclosure.

Figure 4A:
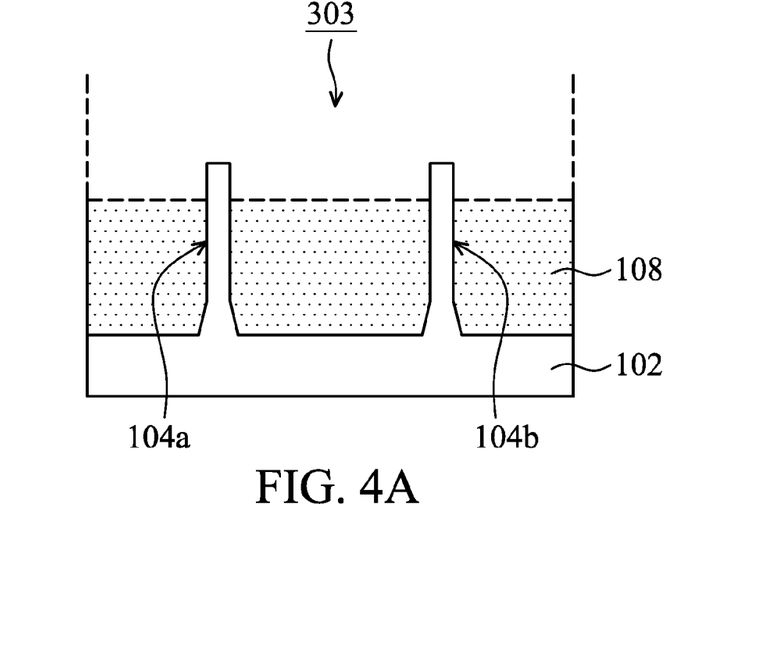
FIGS. 4A-4F show cross-sectional representations of various stages of forming a fin field effect transistor (FinFET) device structure, in accordance with some embodiments.

Referring to FIG. 4A, polysilicon layer 302 is removed to form trench 303. FIG. 4A is similar to FIG. 3C, and so detailed descriptions are omitted for brevity.

Figure 4B:
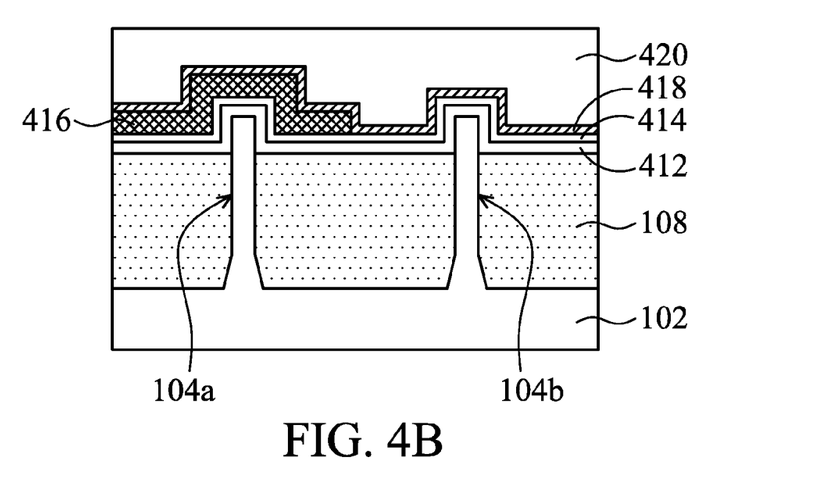

After trench 303 is formed, a high-k gate dielectric layer 412 is conformally formed on fin structures 104a and 104b as shown in FIG. 4B in accordance with some embodiments of the disclosure. High-k gate dielectric layer 412 includes hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like. In some embodiments, high-k gate dielectric layer 412 is formed by deposition processes, such as a CVD process, HDPCVD process, spin-on process, sputtering process, or other applicable processes.

After forming high-k gate dielectric layer 412, diffusion barrier layer 414 is conformally formed on high-k gate dielectric layer 412. Diffusion barrier layer 414 inhibits diffusion of the metal that will be formed later.

Afterwards, a work function layer 416 is formed on diffusion barrier layer 414 and fin structure 104a. Work function layer 416 helps tune a work function for a PMOS transistor. Therefore, a desired threshold voltage is achieved for the PMOS transistor. In some embodiments, work function layer 416 is a p-type work function metal including titanium nitride (TiN), tungsten nitride (WN), tantalum nitride (TaN), or ruthenium (Ru).

Afterwards, on fin structure 104a, a block layer 418 is formed on work function layer 416. On fin structure 104b, block layer 418 is formed on diffusion barrier layer 414. Block layer 418 is configured to block or reduce diffusion between the layer below (e.g. work function layer 416) and the layer above (e.g. a metal fill layer).

Metal fill layer 420 is formed on block layer 418. Therefore, on fin structure 104a, a first gate electrode is constructed by work function layer 416, block layer 418 and metal fill layer 420. On fin structure 104b, a second gate electrode is constructed by block layer 418 and metal fill layer 420. Metal fill layer 420 is configured to serve as the main conductive portion of gate electrode. In some embodiments, metal fill layer 420 includes conductive materials, such as aluminum (Al) or titanium (Ti), tungsten (W), copper (Cu), or combinations thereof.

Figure 4C:
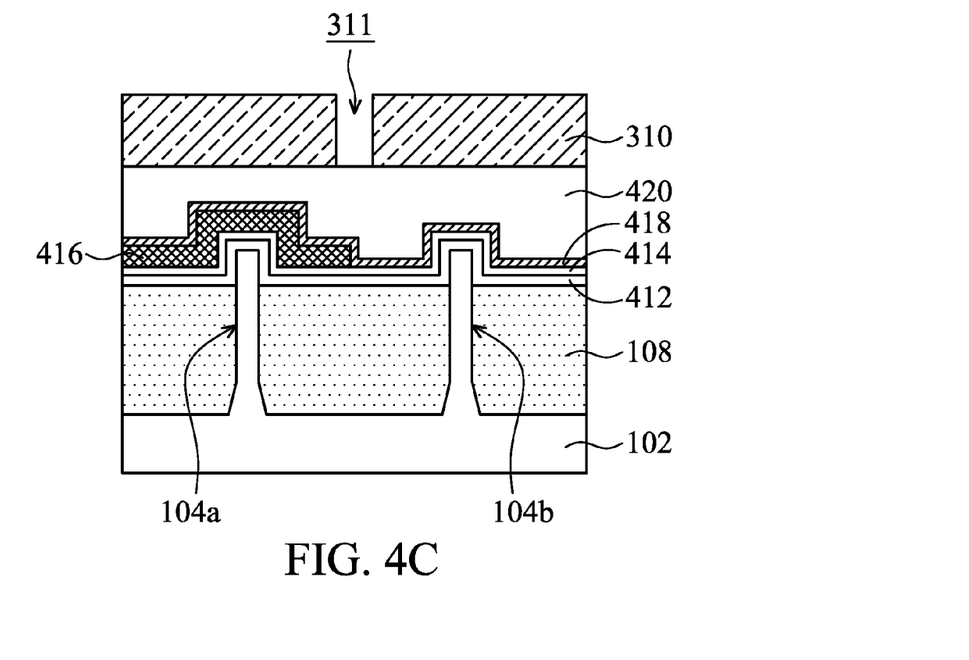

After metal fill layer 420 is formed, photoresist (PR) layer 310 is formed on metal fill layer 420 shown in FIG. 4C in accordance with some embodiments of the disclosure. Afterwards, PR layer 310 is patterned to form opening 311 in patterned photoresist layer 310.

Figure 4D:
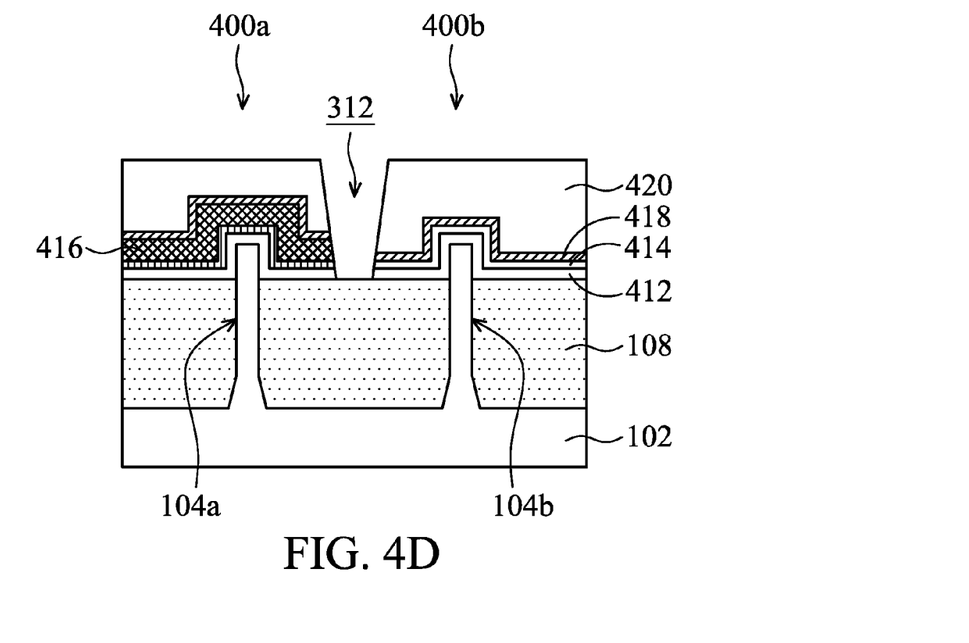

After PR layer 310 is patterned, gate dielectric layer 412, diffusion barrier layer 414, work function layer 416, block layer 418 and metal fill layer 420 are etched by an etching process to form a trench 312 in gate electrode 308 as shown in FIG. 4D in accordance with some embodiments of the disclosure. In some embodiments, the etching process includes a dry etching process or wet etching process.

On the left side of trench 312, a first transistor 400a is constructed by high-k gate dielectric layer 412, diffusion barrier layer 414, work function layer 416, block layer 418 and metal fill layer 420 and a source/drain (not shown). On the right side of trench 312, a second transistor 400b is constructed by high-k gate dielectric layer 412, diffusion barrier layer 414, block layer 418 and metal fill layer 420, and another source/drain (not shown). In some embodiments, first transistor 400a is a PMOS device, and second transistor 400b is a NMOS device.

Figure 4E:
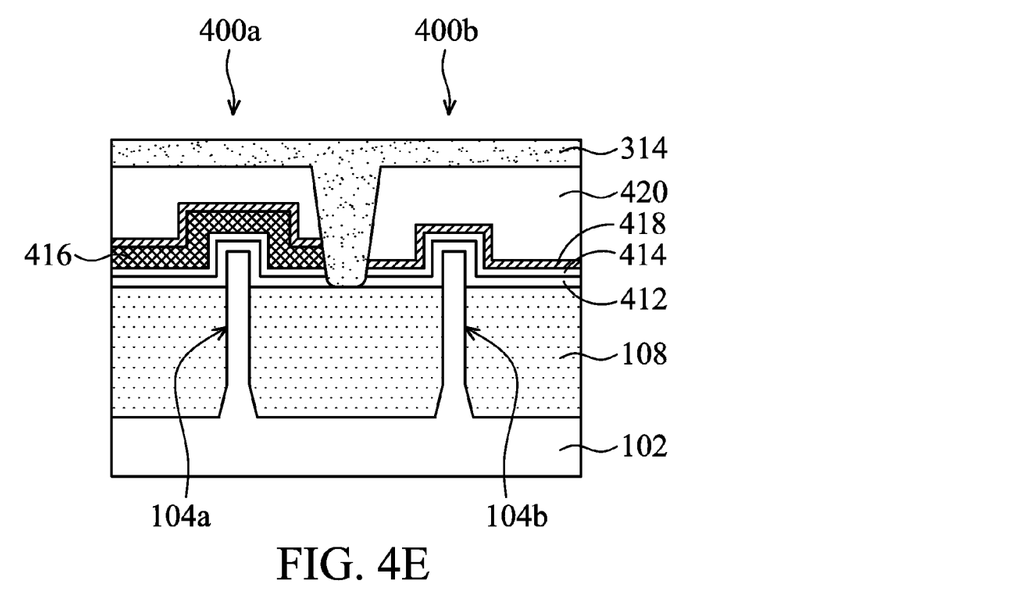

After trench 312 is formed, a dielectric material 314 is filled into trench 312 and on metal fill layer 420 as shown in FIG. 4E in accordance with some embodiments of the disclosure.

Figure 4F:
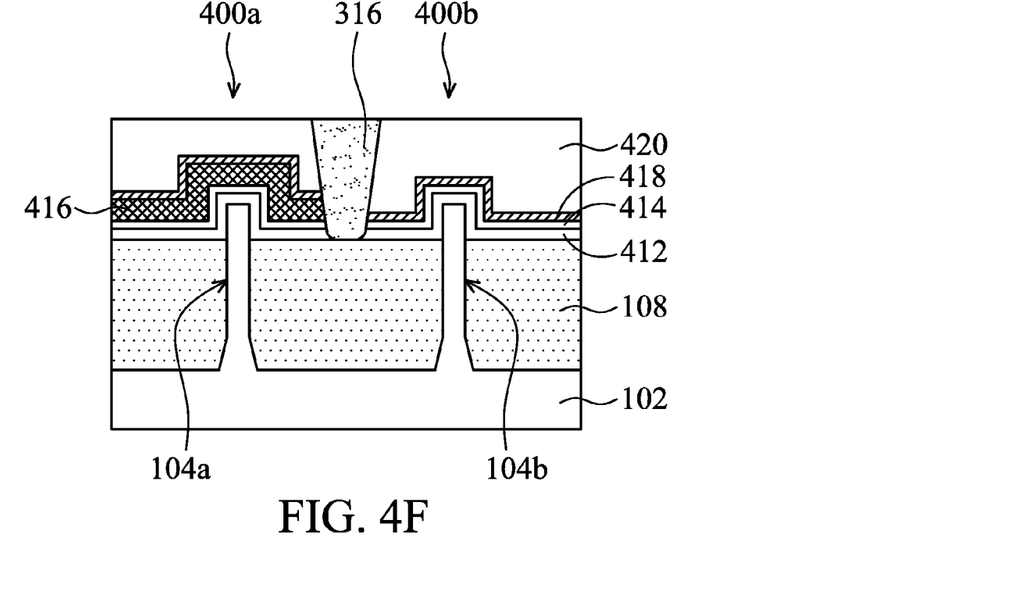

After dielectric material 314 is filled, a portion of dielectric material 314 out of trench 312 is removed by a planarizing process as shown in FIG. 4F in accordance with some embodiments of the disclosure. As a result, an inter-layer dielectric (ILD) structure 316 is formed. First transistor 400a and second transistor 400b are on opposite sidewalls of ILD structure 316.

Embodiments for forming fin field effect transistor (FinFET) device structure are provided. A fin structure is formed on a substrate. A gate dielectric layer and a gate electrode are sequentially formed on the fin structure to form a transistor on the fin structure. An inter-layer dielectric (ILD) structure is formed after the transistor is formed. Problems with forming the gate dielectric layer and gate electrode in a limited distance between the fin structure and the ILD structure are reduced by changing the fabricating operation of the ILD structure. Therefore, the etching process window for forming a trench for filling the ILD structure is enlarged. In addition, the filling windows for forming the gate dielectric layer and the gate electrode are therefore enlarged.

In some embodiments, a fin field effect transistor (FinFET) device structure is provided. The FinFET includes a substrate and a first fin structure extending above the substrate. The FinFET also includes a first transistor formed on the first fin structure. The first transistor includes a first gate dielectric layer conformally formed on the first fin structure and a first gate electrode formed on the first gate dielectric layer. The FinFET further includes an inter-layer dielectric (ILD) structure formed adjacent to the first transistor. The first gate electrode is in direct contact with a sidewall of the ILD structure.

In some embodiments, a fin field effect transistor (FinFET) device structure is provided. The FinFET includes a substrate and a first fin structure and a second fin structure extending above the substrate. The FinFET also includes a first transistor formed on the first fin structure. The first transistor includes a first gate dielectric layer formed on a top surface and sidewalls of the first fin structure and a first gate electrode formed on the first gate dielectric layer. The FinFET also includes a second transistor formed on the second fin structure. The second transistor includes a second gate dielectric layer formed on a top surface and sidewalls of the second fin structure and a second gate electrode formed on the second gate dielectric layer. The FinFET further includes an inter-layer dielectric (ILD) structure formed between the first transistor and the second transistor. The ILD structure is directly sandwiched by the first gate electrode and the second gate electrode.

In some embodiments, a method for forming a fin field effect transistor (FinFET) device structure is provided. The method includes providing a first fin structure and a second fin structure extending above a substrate and conformally forming a gate dielectric layer on the first fin structure and the second fin structure. The method also includes forming a gate electrode on the gate dielectric layer. A first transistor is constructed by the gate dielectric layer and the gate above the first fin structure, and a second transistor is constructed by the gate dielectric layer and the gate above the second fin structure. The method further includes forming an inter-layer dielectric (ILD) structure between the first transistor and the second transistor. The gate electrode is in direct contact with a sidewall of the ILD structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A fin field effect transistor (FinFET) device structure, comprising:
   a substrate;
   an isolation structure formed on the substrate;
   a first fin structure extending above the substrate, wherein the first fin structure is along a first direction;
   a first transistor formed on the first fin structure, wherein the first transistor comprises:
      a first gate dielectric layer conformally formed on the first fin structure; and
      a first gate electrode formed on the first gate dielectric layer; and an inter-layer dielectric (ILD) structure formed adjacent to the first transistor, wherein the first gate electrode is in direct contact with a sidewall of the ILD structure, wherein the sidewall of the ILD structure has a bottom portion and a top portion in a cross-sectional view, the first gate dielectric layer above the isolation structure is in direct contact with the bottom portion of the sidewall of the ILD structure, wherein an upper portion of the first fin structure protrudes from the isolation structure.

2. The fin field effect transistor (FinFET) device structure as claimed in claim 1, wherein the first gate electrode is surrounded by the ILD structure.

3. The fin field effect transistor (FinFET) device structure as claimed in claim 1, further comprising:
a second transistor formed on a second fin structure, wherein the ILD structure is formed between the first transistor and the second transistor.

4. The fin field effect transistor (FinFET) device structure as claimed in claim 3, wherein the second transistor comprises a second gate dielectric layer and a second gate electrode, and the first gate electrode and the second gate electrode are formed on opposite sidewalls of the ILD structure.

5. The fin field effect transistor (FinFET) device structure as claimed in claim 1, wherein the first gate dielectric layer comprises a high-k dielectric layer and a diffusion barrier layer.

6. The fin field effect transistor (FinFET) device structure as claimed in claim 1, wherein the first gate electrode comprises a work function layer, a block layer and a metal fill layer.

7. The fin field effect transistor (FinFET) device structure as claimed in claim 1, wherein the first gate dielectric layer does not cover the overall sidewalls of the ILD structure.

8. The fin field effect transistor (FinFET) device structure as claimed in claim 1, further comprising:
an isolation structure, wherein the first fin structure is embedded in the isolation structure.

9. The fin field effect transistor (FinFET) device structure as claimed in claim 1, wherein a distance between the sidewall of the ILD structure and a sidewall of the first fin structure is in a range from about 5 nm to about 50 nm.

10. A fin field effect transistor (FinFET) device structure, comprising:
a substrate;
an isolation structure formed on the substrate;
a first fin structure and a second fin structure extending above the substate;
a first transistor formed on the first fin structure, wherein the first transistor comprises:
a first gate dielectric layer formed on a top surface and sidewalls of the first fin structure; and
a first gate electrode formed on the first gate dielectric layer;
a second transistor formed on the second fin structure, wherein the second transistor comprises:
a second gate dielectric layer formed on a top surface and sidewalls of the second fin structure; and
a second gate electrode formed on the second gate dielectric layer; and
an inter-layer dielectric (ILD) structure formed between the the first transistor and the second transistor, wherein the ILD structure is directly sandwiched between the first gate electrode and the second gate electrode, and the first gate dielectric layer above the isolation structure is in direct contact with a bottom portion of the sidewall of the ILD structure,
wherein an upper portion of the first fin structure and an upper portion of the second fin structure protrude from the isolation structure.

11. The fin field effect transistor (FinFET) device structure as claimed in claim 10, wherein the first transistor is an n-type Metal-Oxide-Semiconductor Field-Effect-Transistor (NMOSFET), and the second transistor is a p-type Metal-Oxide-Semiconductor Field-Effect-Transistor (PMOSFET).

12. The fin field effect transistor (FinFET) device structure as claimed in claim 10, wherein the first gate dielectric layer and the second gate dielectric layer are made of the same material.

13. The fin field effect transistor (FinFET) device structure as claimed in claim 10, wherein the first gate electrode and the second gate electrode are made of different materials.

14. The fin field effect transistor (FinFET) device structure as claimed in claim 3, wherein the first transistor is an n-type Metal-Oxide-Semiconductor Field-Effect-Transistor (NMOSFET), and the second transistor is a p-type Metal-Oxide-Semiconductor Field-Effect-Transistor (PMOSFET).

15. The fin field effect transistor (FinFET) device structure as claimed in claim 10, wherein the first gate electrode comprises a work function layer, a block layer and a metal fill layer.

16. The fin field effect transistor (FinFET) device structure as claimed in claim 10, wherein the sidewall of the ILD structure has a bottom portion and a top portion, the first gate dielectric layer covers the bottom portion of the sidewall of the ILD structure, and the first gate electrode covers the top portion of the sidewall of the ILD structure.

17. The fin field effect transistor (FinFET) device structure as claimed in claim 10, wherein a distance between the sidewall of the ILD structure and a sidewall of the first fin structure is in a range from about 5 nm to about 50 nm.

* * * * *